United States Patent [19]

Richman

[11] 4,023,195
[45] May 10, 1977

[54] MOS FIELD-EFFECT TRANSISTOR STRUCTURE WITH MESA-LIKE CONTACT AND GATE AREAS AND SELECTIVELY DEEPER JUNCTIONS

[75] Inventor: Paul Richman, St. James, N.Y.

[73] Assignee: SMC Microsystems Corporation, Hauppauge, N.Y.

[22] Filed: Jan. 30, 1976

[21] Appl. No.: 653,912

Related U.S. Application Data

[63] Continuation of Ser. No. 517,299, Oct. 23, 1974, abandoned.

[52] U.S. Cl. .................................. 357/23; 148/1.5; 357/41; 357/50; 357/52; 357/54
[51] Int. Cl.² ......................................... H01L 29/78
[58] Field of Search .................. 357/23, 41, 50, 54, 357/52

[56] References Cited

UNITED STATES PATENTS

| | | | |
|---|---|---|---|
| 3,751,722 | 8/1973 | Richman | 357/23 |
| 3,755,001 | 8/1973 | Kooi et al. | 357/23 |
| 3,832,248 | 8/1974 | Bazin et al. | 357/23 |
| 3,873,383 | 3/1975 | Kooi | 357/50 |

OTHER PUBLICATIONS

Appels et al., "Local Oxidation of Silicon," *Philips Research Reports*, vol. 25, 1970, pp. 126–129.

Primary Examiner—William D. Larkins
Attorney, Agent, or Firm—Hopgood, Calimafde, Kalil, Blaustein & Lieberman

[57] ABSTRACT

An MOS field effect transistor includes a substrate in which source and drain regions are formed. A thick silicon dioxide layer is selectively formed on the upper surface of the substrate, so that in the resulting structure, the junction depth associated with the source and drain regions is selectively greater at contact locations and at the portions of the source and drain regions that are in contact with the active channel.

3 Claims, 9 Drawing Figures

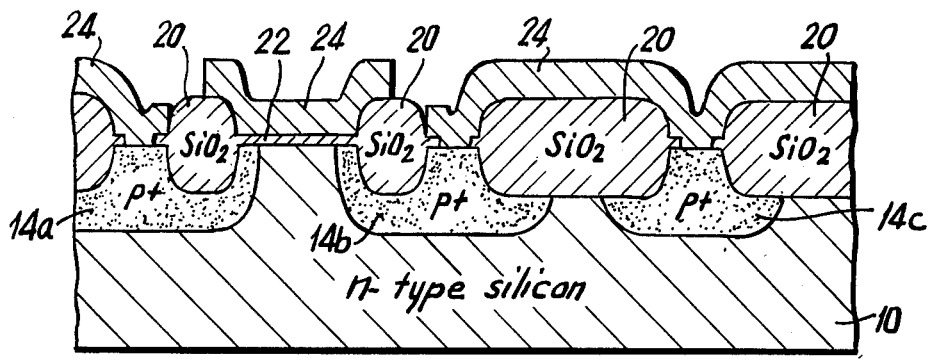
FIG. 1
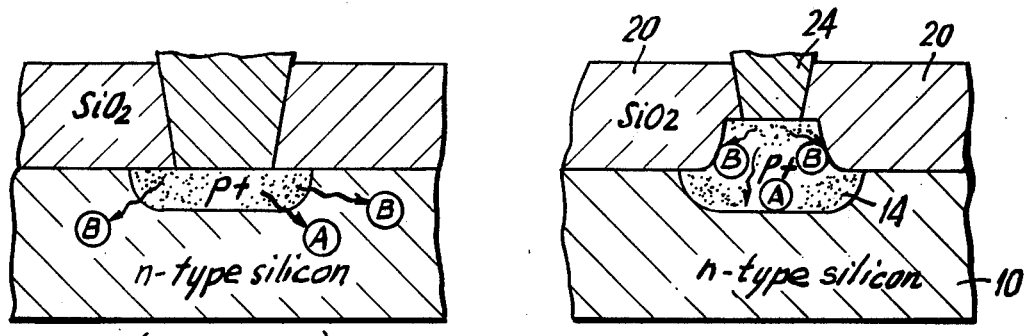
FIG. 3a (PRIOR ART)
FIG. 3b
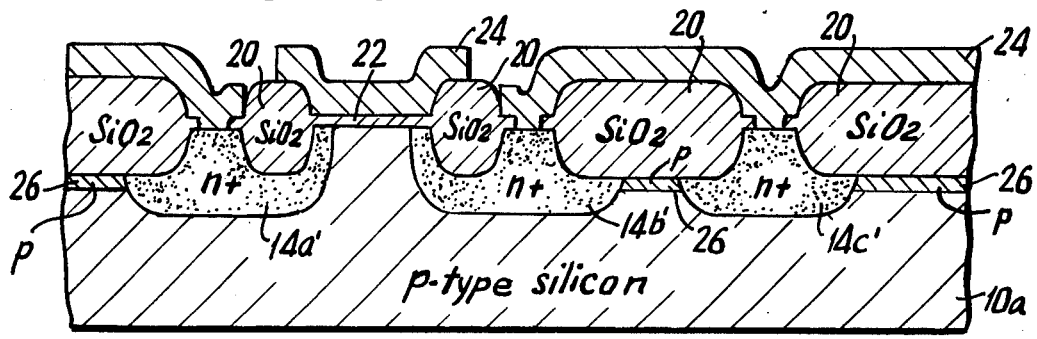
FIG. 4
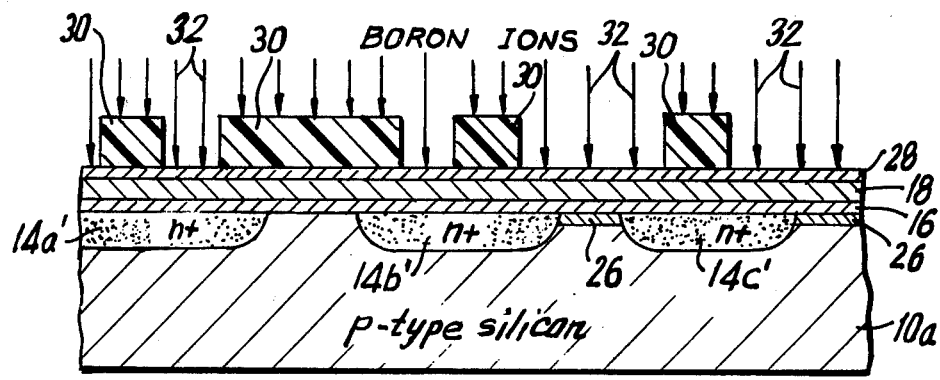
FIG. 5

MOS FIELD-EFFECT TRANSISTOR STRUCTURE WITH MESA-LIKE CONTACT AND GATE AREAS AND SELECTIVELY DEEPER JUNCTIONS

This application is a continuation of application Ser. No. 517,299, filed Oct. 23, 1974, now abandoned.

The present invention relates generally to metal-oxide-silicon (MOS) devices, and more particularly to an MOS field effect transistor having selectively deeper junctions and shallower oxide step heights at contact openings and gate locations.

A conventional MOS device includes what may be termed thick oxide cliffs or sharp steps at all gate and contact hole locations. The height of these steps is equal to the thickness of the thick oxide layer, which is typically between 15,000 to 20,000 angstroms. These sharp steps give rise to a number of problems that adversely affect the yield and reliability of the MOS device. In particular, the aluminum metallization layer that is subsequently deposited over the thick oxide layer tends to be severely thinned out as it passes over these sharp steps such that the metallization layer often fractures completely, thereby resulting in a functional failure of the integrated circuit.

In general, this tendency to fail can be minimized only by the use of multidirectional or planetary evaporation systems, careful control of oxide step shape, and the use of very thick metal layers which significantly add to the complexity and cost of the fabrication process. If such precautions are not taken, open circuits will frequently occur at the step locations, and even if continuity in the metallization layer is initially observed, the MOS integrated circuit would still be highly susceptible to long-term failure as a result of electromigration because of the substantially higher current density in the metal where the thinning takes place.

Another frequently observed problem at thick oxide step locations pertains to photo resist coverage for both the contact hole and the metallization steps of the conventional fabrication process. If the step height and step shape are particularly severe, photo resist thinning occurs on the sides or side walls of the step locations and the exposure of the resist from the vertical direction with the ultra violet light source will be non-uniform. This results in a tendency for increased pinholing and resist lifting which will result in a device failure.

Another problem that is observed in virtually all MOS integrated circuit structures, and not necessarily at step locations, is aluminum spiking across p-n junctions as a result of high temperature alloying that occurs after metallization. This phenomenon is also sometimes referred to as preferential aluminum alloying along grain boundaries and is described at pages 424–425 of "MOS Integrated Circuits," edited by Penney and Lau, and published in 1972 by Van Nostrand Reinhold Company, New York. This mechanism can lead to the shorting out of back-biased p-n junctions or to excessive reverse leakage, both of which can lead to failure in an integrated circuit.

It is a general object of the invention to provide an MOS field effect transistor having greater reliability and greater yield.

It is a further object of the invention to provide an MOS field effect transistor of the type described having a significantly reduced likelihood of failure of the interconnecting metallization layer.

It is another object of the invention to provide an MOS device of the type described in which aluminum spiking across p-n junctions as a result of high-temperature alloying after metallization is substantially eliminated.

In the MOS field effect transistor of the present invention, portions of the source and drain and other diffused regions extend above the surface of the substrate in mesa-like regions. Portions of the thick oxide layers extend into these regions such that the depth of the p-n junctions associated with the source and drain regions is selectively greater at contact locations; that is, where the metallization layer makes contact to those regions. Moreover, the junction depth is also increased at all gate locations at the edges of the source and drain regions, which are in contact with the active channel region.

To the accomplishment of the above and to such further objects as may hereinafter appear, the present invention relates to a MOS field effect transistor substantially as defined in the appended claims and as described in the following specification taken together with the accompanying drawings, in which:

FIG. 1 is a cross-sectional diagram of an MOS transistor structure according to one embodiment of the invention;

FIGS. 3a and 3b are respectively fragmentary crossectional diagrams of the contact location of a conventional MOS structure and of a MOS structure according to the present invention, illustrating one of the advantages of the latter over the former;

FIG. 4 is a cross-sectional diagram of an MOS structure according to an alternate embodiment of the invention; and FIG. 5 is a cross-sectional diagram illustrating one of the steps employed in the fabrication of the MOS structure of FIG. 4.

The present invention is directed toward an improved MOS transistor structure characterized by a reduction in the total step height of the thick oxide regions and by a selectively increased junction depth at all contact locations. The structure is illustrated in FIG. 1 with respect to one embodiment thereof; the process for fabricating that structure is illustrated in FIGS. 2a–2d.

In that process, as illustrated, a layer of silicon dioxide is thermally grown on a silicon wafer or substrate 10, shown as being of n-type conductivity. The wafer is then coated with a photoresist pattern in a known manner and the resist is selectively exposed with ultraviolet light, and the unwanted portions of resist are removed using a developing process. Using the remaining photoresist pattern as a mask, the uncovered areas of the silicon dioxide layer are etched away to leave masking silicon dioxide regions 12 on the surface of the substrate. The remaining resist is then stripped away and p-type impurities, such as boron, are diffused into the exposed areas of the substrate to form p+ regions 14.

Figure 2A:
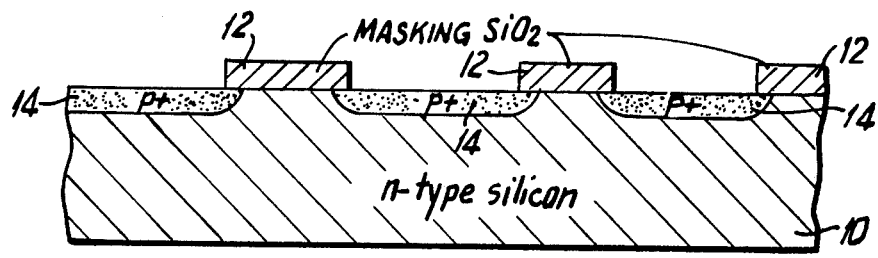
FIGS. 2a–2d are cross-sectional diagrams illustrating successive stages in the fabrication of the structure of FIG. 1.
Figure 2B:
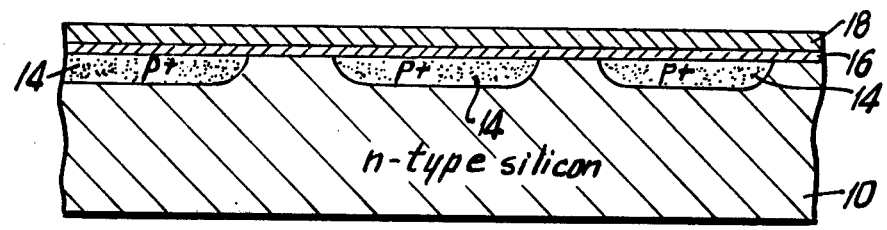

Thereafter, as shown in FIG. 2b, the masking silicon dioxide regions 12 are etched away and a thin (e.g., 500 to 1,000 A) layer 16 of silicon dioxide is thermally grown on the substrate 10. Layer 16 is then covered with a thicker (1,500 to 3,000 A) layer 18 of silicon nitride.

A thin layer of silicon dioxide (not shown in the drawings) is pyrolitically deposited over silicon nitride layer 18 and is coated with a second photoresist layer, which is patterned in a known manner to form a second photoresist mask, in which photoresist remains only over all intended channel (gate) and contact areas.

Figure 2C:
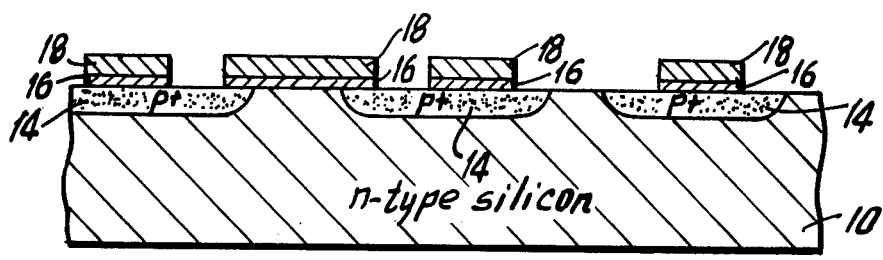

Using this second photoresist mask, the exposed portions of the pyrolitically deposited silicon dioxide layer are etched away. The photoresist mask is then removed and the remaining portions of the pyrolitically deposited silicon dioxide layer are used as a third mask to etch away the exposed portions of silicon nitride layer 18. Using the remaining silicon nitride portions as a fourth mask, the exposed portions of the underlying thermally grown silicon dioxide layer 16 are etched away and the remaining silicon dioxide layer overlying the silicon nitride layer is also removed. The resulting structure upon the completion of this stage of the process is illustrated in FIG. 2c.

Thereafter, those portions of the upper surface of the silicon substrate 10 that are not covered by silicon nitride are locally oxidized at an elevated temperature to a thickness of between 12,000 and 20,000 A. In this operation, the thick oxide grows both in the upward and downward directions. Moreover, the elevated temperatures employed in the thermal local oxidation procedure cause the impurities in the diffused regions 14 to diffuse downwardly into the substrate.

Upon the completion of the local oxidation, the thin layer of silicon nitride that was converted into an oxide during this process is etched from the upper surfaces of the remaining silicon nitride portions and these silicon nitride portions are then removed such as by the use of a phosphoric acid. The underlying silicon oxide layer 16 is then etched away, during which time the thick oxide regions are thinned down slightly. Thereafter, a thin (1,000 to 1,600 A) silicon oxide gate insulator film is grown over the exposed portions of the silicon substrate.

Figure 2D:
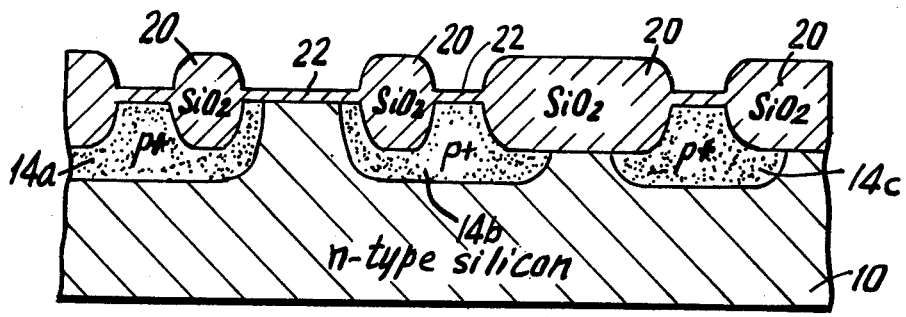

Upon the completion of this process, the structure has the appearance shown in FIG. 2d in which thick silicon oxide regions 20 extend both upwardly from and downwardly into the silicon substrate and into the diffused regions 14a, 14b, and 14c. It will be noted that the depth of the diffused regions is significantly increased at certain locations as compared to the depths of those regions in the intermediate structure shown in FIG. 2c, as a result of the downward diffusion of the p-type impurities during the thermal oxidation procedure. The remaining portion of the substrate is then covered by a thin silicon oxide film 22, a portion of which serves as the gate insulator film of the completed MOS transistor. (This gate insulator film could alternately be formed as a combination of insulators such as silicon dioxide and silicon nitride.)

Significantly, it will be noted that in the structure of FIG. 2d, the depth (measured from the upper surface of the silicon substrate) of the junction between the diffused regions and the substrate is selectively increased at all the contact regions and the edges of all the gate locations; that is, those regions that were covered by the silicon nitride-silicon dioxide sandwich in the structure of FIG. 2c and in which accordingly, no thick oxide growth has occurred.

The MOS structure according to this embodiment of the invention is then completed by etching contact holes at selected portions of the thin oxide film 22, and thereafter depositing a thick metallization layer, such as aluminum, over the substrate. The metallization pattern is then selectively etched away to leave the final metallization pattern 24 (FIG. 1) which makes selective contact to the upper surface of the diffused regions 14a, b and c.

Referring to the completed MOS structure of FIG. 1, two novel and significant features of that structure will be readily apparent. First, as noted previously, the depth of the p-n junctions between the p+ diffused regions 14a, b and c and the n-type substrate 10 is selectively greatest only at the contact locations, that is, at those locations, underlying the areas of the diffused regions that are in direct contact with the metallization layer, and at the gate locations at the edges of the source and drain regions (diffused regions 14a and 14b) which are in direct contact with the active channel regions associated with an MOS field-effect transistor.

Thus, the contact locations in the structure of the invention are, in essence, raised on mesas extending from the substrate and are completely surrounded by the lower portions of thick silicon dioxide regions 20. The junction depths at the contact locations are in the order of 2.5 to 3.5 microns as compared to the junction depths of between 1.5 and 2.5 microns at the other locations in the integrated circuit structure. Moreover, the edge portions of the diffused regions which are immediately adjacent the active channel extend to the surface of the substrate mesa and are spaced from the contact locations by portions of the thick oxide region.

One significant advantage of the selectively deeper junctions at the contact locations is the virtual elimination of the undesirable aluminum alloying along the grain boundaries, as described above. In particular, as can be seen in the prior art structure schematically illustrated in FIG. 3a, aluminum can preferentially alloy along grain boundaries and spike through the p-n junctions as a result of two mechanisms. The spiking can take place in the vertical direction and penetrate the "bottom" side of the junction (indicated by the arrow A in FIG. 3a), or in the horizontal direction by penetrating the sides or edges of the junction (indicated by the arrows B in FIG. 3a).

However, as can be seen in FIG. 3b, the use of the structure according to the invention virtually eliminates both of these mechanisms. That is, spiking in the horizontal direction is totally eliminated because there is no junction since the p+ diffused region is completely surrounded in the horizontal direction by insulating silicon dioxide layers 20. Spiking in the vertical direction is also effectively minimized because the actual junction depth at the contact hole locations is much greater than in conventional structures. Hence, the probability of aluminum alloying to the much deeper junction boundary in the vertical direction is greatly reduced.

The second significant advantage of the MOS structure of the invention, as illustrated in the embodiment of FIG. 1, is that the total step height encountered by the metallization layer at the vertical walls of the thick oxide layers is reduced by at least 50 percent as compared to conventional MOS structures. As a result, the problems of metal thinning and non-uniform photoresist coverage and exposure that arise in the prior art MOS structures of this type, as discussed previously, are substantially reduced if not eliminated by the structure of the present invention. This is particularly important at the contact locations, which unlike the gate areas often carry relatively large currents on a steady-state basis.

An alternate embodiment of the invention is illustrated in FIG. 4 for an n-channel MOS structure. That structure, in which elements corresponding to those of the embodiment of FIG. 1 are identified by corresponding reference numerals, includes a p-type silicon substrate 10a and n+ diffused regions 14a', 14b', and 14c' formed therein in the manner described previously with respect to the embodiment of FIG. 1.

In addition, in the embodiment of FIG. 4, p regions 26 of higher acceptor doping concentration than found in the p-type substrate are formed in the silicon substrate at those locations underlying the thick oxide layers 20 between adjacent n+ diffused regions. As disclosed in U.S. Pat. No. 3,751,722, the inclusion of the p regions in the n-channel structure, as shown in FIG. 4, serves to effectively eliminate both field inversion and parasitic punch through.

One manner of fabricating the structure of FIG. 4, is illustrated in FIG. 5, which corresponds to the intermediate structure of FIG. 2b and further includes a thin layer 28 of pyrolitically deposited silicon dioxide over which a photoresist 30 is selectively formed to expose the surface of those areas at which it is desired to form the p regions 26. The substrate is then subjected to an implantation of boron ions indicated at 32. The photoresist acts as an implantation barrier so that the boron ions pass through the exposed multilayer silicon dioxide — silicon nitride — silicon dioxide sandwich, and penetrate only into the potential parasitic areas between the active areas which will eventually underlie the thick oxide layers in the final structure, as desired, and into the portions of the n+ regions 14' not covered by the resist. However, because of the relatively low concentration of the p-type boron ions in regions 26 (e.g., between $5 \times 10^{15}$ and $5 \times 10^{17}$ per cm$^3$), the boron ion implantation has virtually no effect on the n+ regions which typically have a concentration of between $10^{19}$ and $10^{21}$ per cm$^3$.

It will thus be appreciated that an improved MOS structure characterized inter alia by selectively deeper p-n junctions at the contact and gate areas has been described. Although, the structure has been specifically described hereinabove with respect to two embodiments, it will be apparent that modifications may be made thereto without necessarily departing from the true spirit and scope of the invention.

What is claimed is:

1. An MOS transistor structure comprising a substrate of a first conductivity type; regions including spaced source and drain regions of a second conductivity type formed in one major surface of said substrate, an active channel being established in said substrate between said source and drain regions, an insulating thick oxide layer selectively formed on said substrate and having a portion extending below said major surface and into each of said source and drain regions, an aluminum layer selectively formed over said thick oxide layer, said portion establishing in each of said source and drain regions a perimetral side wall of a mesa-like contact segment extending to said major surface, said mesa-like contact segments each having an upper surface at which contact of said source and drain regions, respectively, is made with sections of said aluminum layer, an outer segment adjacent to the active channel and spaced from said contact segment by said portion of said thick oxide layer and extending to said major surface and in contact with said active channel, and a central segment underlying said portion of said thick oxide layer and extending between said contact segment and said outer segment, such that the depth of the junction between said source and drain regions and said substrate at said contact segments is at least 2.5 microns and exceeds the depth of the junction at said central segments by at least 0.5 micron, and said perimetral wall of said contact segment is surrounded by said portion of said insulating oxide layer; whereby the likelihood of aluminum spiking through said source and drain regions to which aluminum contact is made into said substrate in both the vertical and horizontal directions is effectively prevented.

2. The MOS structure of claim 1, further comprising additional regions of said first conductivity type and at a higher impurity concentration than that of said substrate selectively formed in said substrate underlying the portion of said thick oxide layer extending between two of said regions not associated with a common MOS transistor.

3. The MOS transistor structure of claim 1, in which the junction depth of said contact segment is between 2.5 and 3.5 microns, and the junctions depth of said central segment is between 1.5 and 2.5 microns.

* * * * *